United States Patent [19]

Lovrenich

[11] Patent Number: 4,621,200
[45] Date of Patent: Nov. 4, 1986

[54] CONTROL DEVICE INCLUDING A CONDUCTIVELY ISOLATED DEPLUGGABLE CONTROLLER

[76] Inventor: Rodger T. Lovrenich, 209 Whispering Sands, Santa Teresa, N. Mex. 88008

[21] Appl. No.: 700,456

[22] Filed: Feb. 11, 1985

[51] Int. Cl.⁴ .............................................. H02J 3/00
[52] U.S. Cl. .................................. 307/149; 307/150; 307/154
[58] Field of Search ......................... 307/149, 150, 154

[56] References Cited

U.S. PATENT DOCUMENTS

| | | | |
|---|---|---|---|
| 4,161,650 | 7/1979 | Caouette et al. | 307/150 X |
| 4,280,064 | 7/1981 | Yamaguchi et al. | 307/149 |
| 4,338,951 | 7/1982 | Saliga | 307/149 X |

Primary Examiner—William M. Shoop, Jr.
Assistant Examiner—Alfred F. Hoyte, Jr.
Attorney, Agent, or Firm—Barnes, Kisselle, Raisch, Choate, Whittemore & Hulbert

[57] ABSTRACT

A control device includes an electrically contactless depluggable logic module such as a computer that is used to interface between a power supply and input and output elements to process a system of control signals. There are no electrical connections to the logic module. This eliminates electromagnetic interference and conducted line interference. The power supply is magnetically coupled to the logic module. Information and control signals are optically coupled to the logic module. It is a free standing, environmentally immune unit, electrically isolated from the outside world.

25 Claims, 20 Drawing Figures

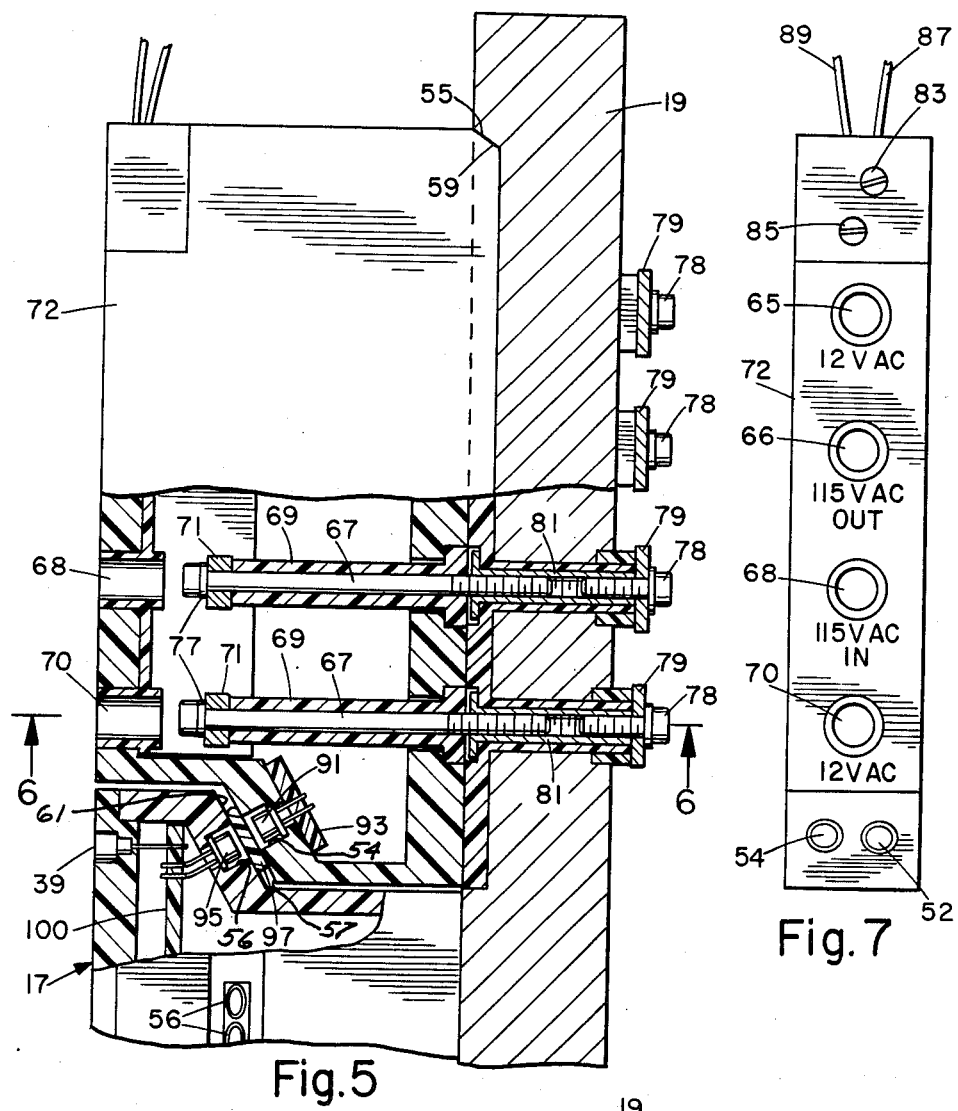
Fig. 5
Fig. 7
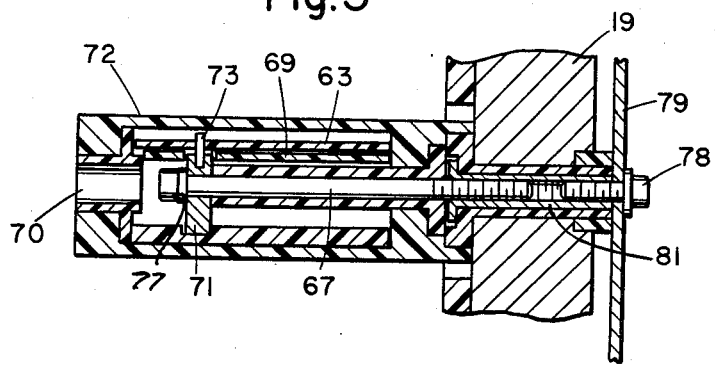
Fig. 6

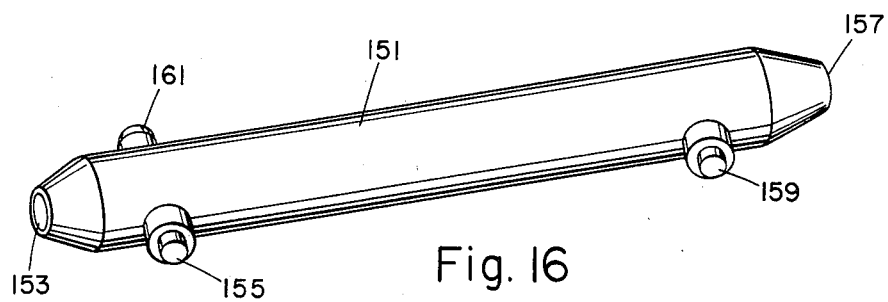
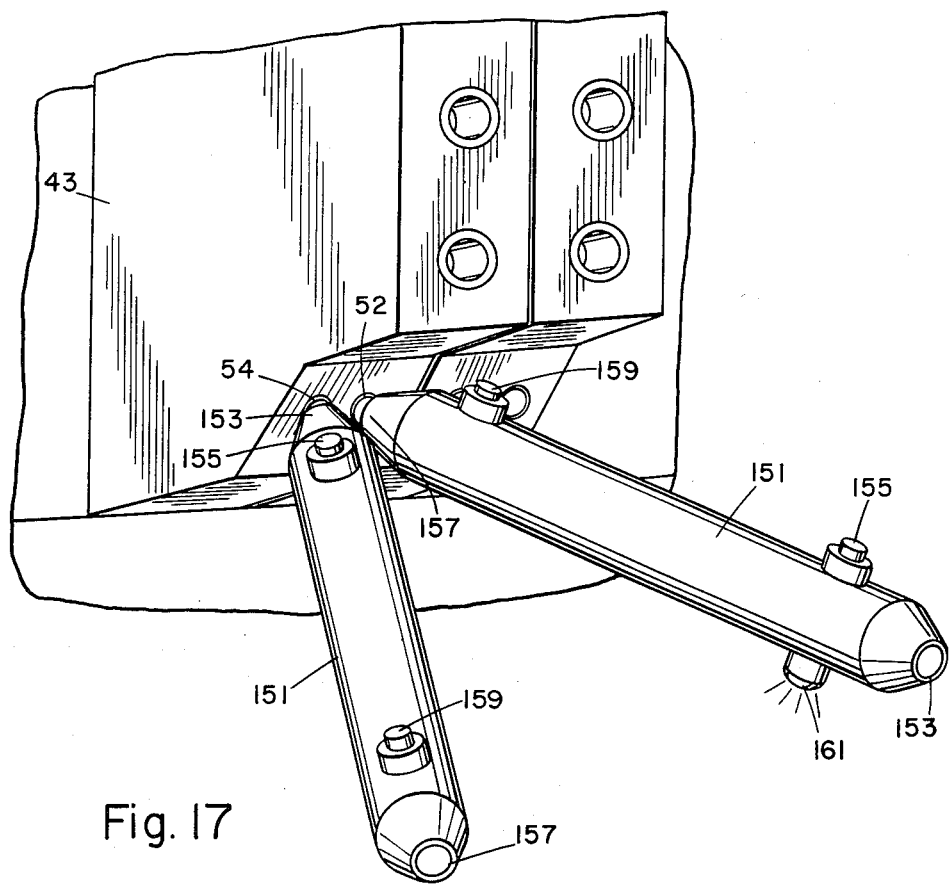

CONTROL DEVICE INCLUDING A CONDUCTIVELY ISOLATED DEPLUGGABLE CONTROLLER

The present invention relates to a control device including a contactless, depluggable logic or control module that is magnetically coupled to a power source, and optically coupled to a signal input/output (I/O) structure.

BACKGROUND OF THE INVENTION

The invention will be described in relation to a work station control system of an automated production line known as a "transfer line" wherein the work station is one of several work stations that communicate with each other and with an orchestrater computer on an optic communication loop. The communication system is shown in co-pending patent application entitled "Distributed Logic Control System and Communication Loop".

Typical computerized work stations in an industrial transfer line use large amounts of wiring at high material and labor cost. In addition, such wiring is subject to electrical and magnetic interference in such surroundings, and suffers a high failure rate because of the number of electrical terminations. Plug-in electrical connections such as edge connectors substantialy increase the possibility of failure. Filters are used to suppress unwanted noise and potting is employed to shield the devices mechanically but none of the systems include both electrical and mechanical isolation. Conventional systems are fixed after failure has occurred. The diagnosis of the failure is a complex and time-consuming job. Repair is costly because of the need for maintenance personnel to go through antiquated diagnostic procedures. Little thought has been given to providing a construction that substantially reduces the opportunity for a maintenance or repair person to make such an error. Instead, much time and money is spent training such a person in methods of ferreting out ambiguous situations.

SUMMARY OF THE INVENTION

A preferred embodiment of the present invention includes a logic module for generating and receiving optic signals. The logic module is magnetically coupled to a power supply module. Input/output (I/O) elements are positioned adjacent the logic module and communicate with the logic module by optic coupling. The logic module is thus coupled with the I/O elements and with the power supply without electrical contacts. The construction can be used in industrial environments where dirt and magnetic and electrical noise are prevalent.

DRAWING DESCRIPTION

In the drawings:

FIG. 5 is an enlarged sectional view taken on line 5—5 of FIG. 3.

FIG. 6 is a sectional view taken on line 6—6 of FIG. 5.

FIG. 7 is a front view of an I/O module.

FIG. 16 is a perspective view of a testing device used to test the apparatus of the present invention for error.

FIG. 17 is a perspective view showing the testing device of FIG. 6 used in testing an I/O module.

DETAILED DESCRIPTION

The present invention is demonstrated as used in cooperation with a Distributed Logic Conrol System and Communication Loop disclosed in a co-pending patent application, Rodger T. Lovrenich and Robin H. Leaf inventors, and will be described as used in such a system although it will be apparent that it could be used with other systems.

Figure 1:
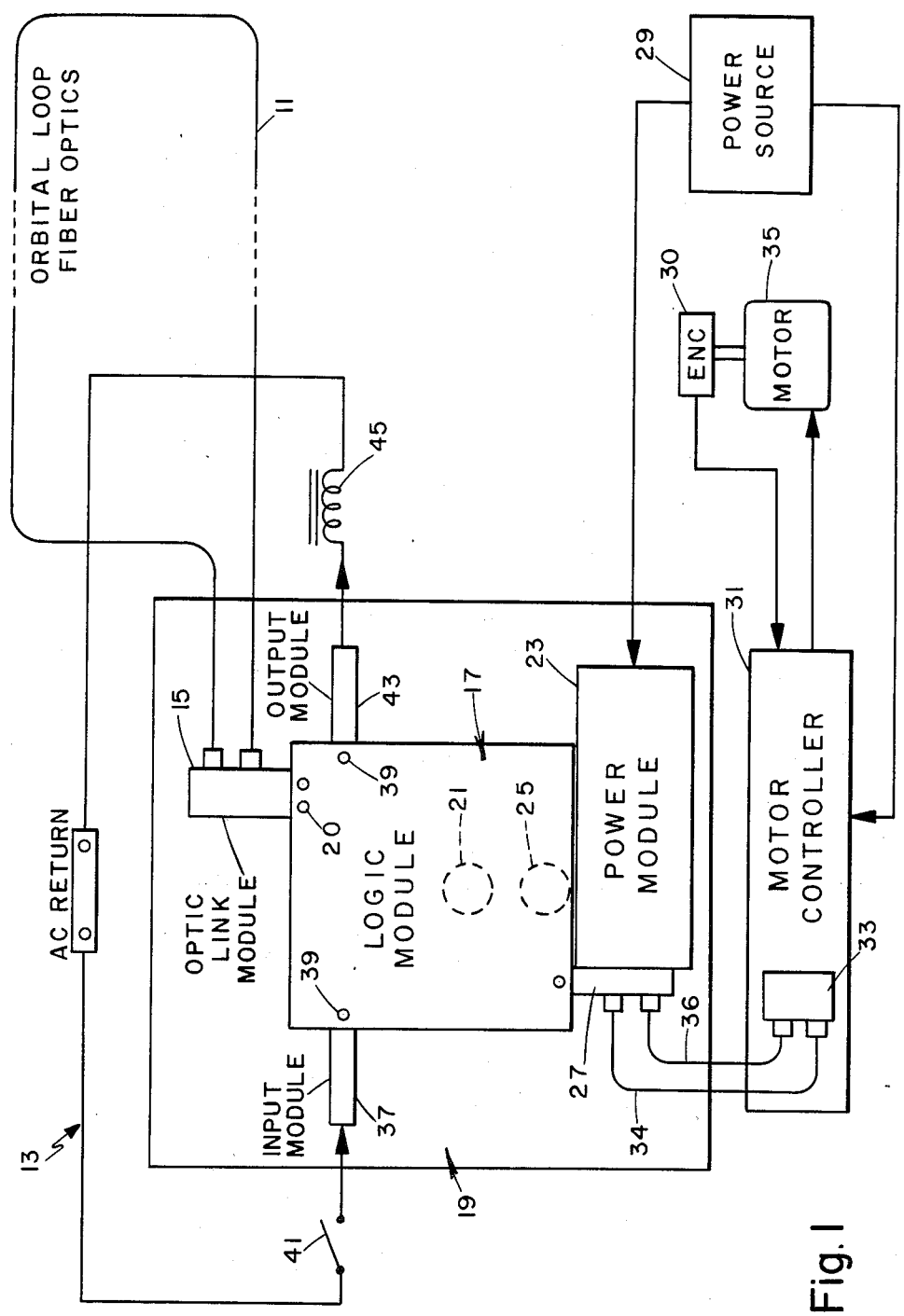
FIG. 1 is a schematic of a work station of a control device constructed in accordance with the present invention shown connected to an orbital communication loop that contains other stations (not shown).

FIG. 1 demonstrates the use of the present invention in the Distributed Logic Control System and Communication Loop referred to above. An orbital loop is shown in broken lines at 11 and represents a fiber optical communication loop including an orchestrater computer and station computers that are not shown. Optic signals are transmitted and received on the fiber optic loop. The number 13 indicates a station embodying the present invention. The station includes a fiber optic link 15 that is optically coupled to the loop 11 for transmitting and receiving optic signals between the loop 11 and the station 13. This link includes a watch dog relay that can shut down the system if it detects an error.

A depluggable logic module 17, such as a computer or programmable controller, is connected to the back plane 19 that is contained in a control box. The control box enclosure is not shown in this view for the sake of simplicity. Indicating lights are located at 20 to show whether or not signals are passing between the fiber optic link 15 and the logic module 17. The logic module includes a personality module 21 that identifies this particular work station as explained later. A power module 23 is mounted on the back plane 19 and is magnetically coupled with the logic module by a coupling transformer 25. The power module is optically coupled to the logic module by the fiber optic link 27 and is connected to an a.c. power source 29. The power module is also optically coupled to a motor controller 31 through the fiber optic link 27 and the fiber optic link 33 via fiber optic cables 34 and 36. The motor controller 31 is connected to a.c. power source 29 and to electric motor 35 that has encoder 30 on its shaft.

An input module is indicated at 37 in FIG. 1 and is optically coupled to the logic module 17. The logic module 17 includes indicator lights 39 on its face adjacent the I/O modules to give a visual indication of whether or not signals are being transmitted between the logic module and the I/O module. The input module is electrically connected to a sensor such as a limit swith 41. When the limit switch is opened or closed, this condition is transmitted through the input module 37 to the logic module 17 and may be transmitted by the logic module 17 onto the orbital loop 11 through the optic link 15.

An output module 43 is optically coupled to logic module 17 and is electrically connected to a device such as solenoid 45 that may be used to operate a clamp (not shown). The switch 41 is closed to indicate that the clamp is closed for example.

Assume that the orchestrater computer (not shown) sends an instruction on the loop 11 to the work station logic module 17 through the optic link 15 telling the work station to carry out a program in the memory of logic module 17 that moves a clamp to a work piece and reports when the work piece is clamped. This instruction takes the form of a binary word that is interpreted in the logic module to do certain things according to a table in the logic module. The logic module 17 sends a signal through the output module 43 to the solenoid 45 that moves the clamp (not shown) to the engaged position. When the clamp is in the engaged position it closes limit switch 41 and this fact is reported back through input module 37 to the logic module 17.

Assume further that the program in the logic module 17 includes certain other instructions. For instance, the logic module 17 may give a command through the fiber optic link 34 to the motor controller 31 to carry out other steps in the program such as move a machine slide to a predetermined position at rapid speed, move the slide to a second position at work speed, and return the slide to the starting position. Pursuant to its program, motor controller 31 activates the machine slide motor 35 to move the machine slide according to the plan and reports its movements via encoder 30 back to the motor controller. The results of the program are reported via the fiber optic cable 36 to the logic module 17. Information regarding the program is reported by the logic module 17 through the fiber optic link 15 onto the loop 11.

Figure 2:
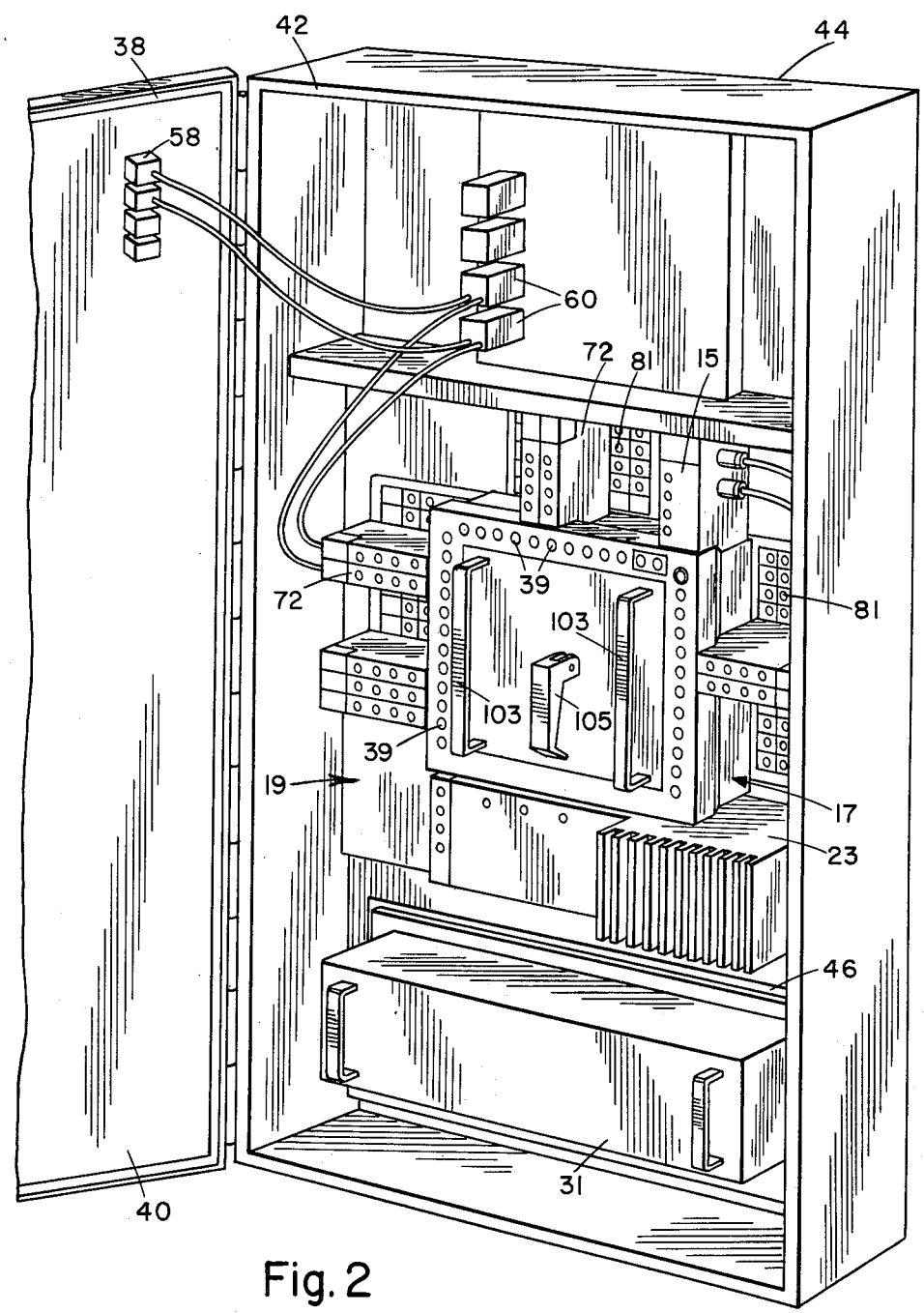
FIG. 2 is a perspective view of the control device mounted in an enclosure with the enclosure door open.

FIG. 2 is a pictorial representation of the control device shown schematically in FIG. 1. A flexible seal 38 is located inside the door 40 of the control box 44 to seal with the edge 42 of the box 44 when the door is closed. A seal 46 is positioned on the back panel 19 around the opening 48 in the back panel and box to seal the opening when the heat sink 50 from the motor controller 31 is inserted through the opening, as in FIG. 8, and the motor controller is attached in place by suitable means such as cap screws.

Figure 3:
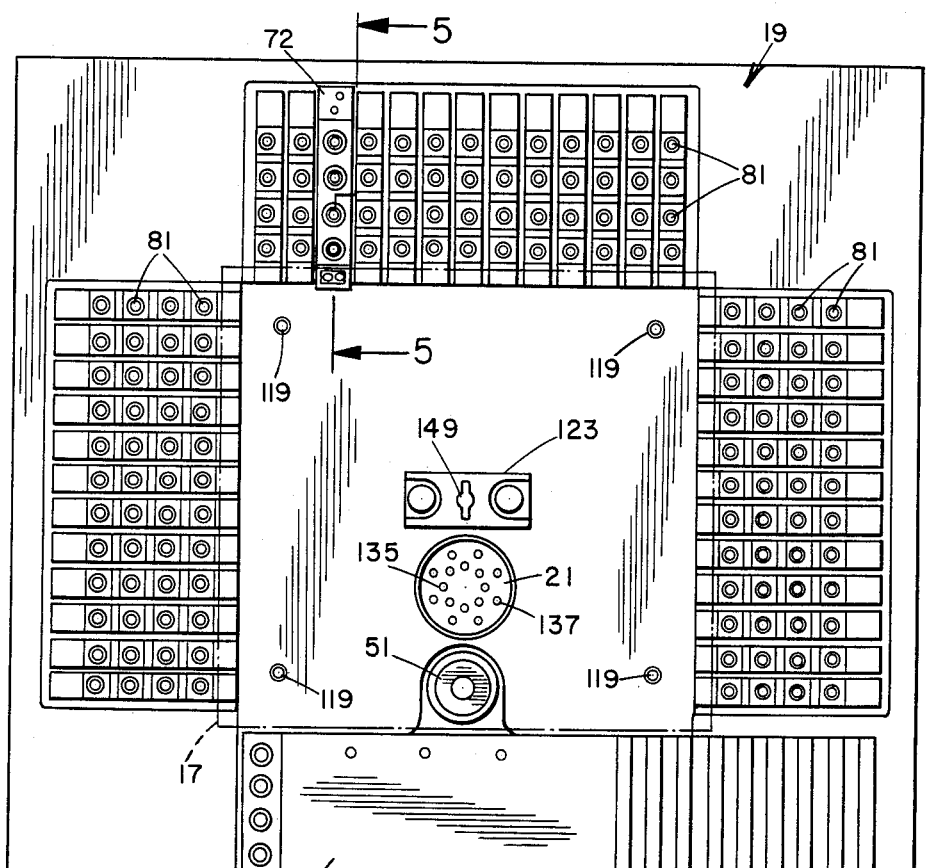
FIG. 3 is a partial front view of the back plane showing the mounting and connection arrangement.
Figure 4:
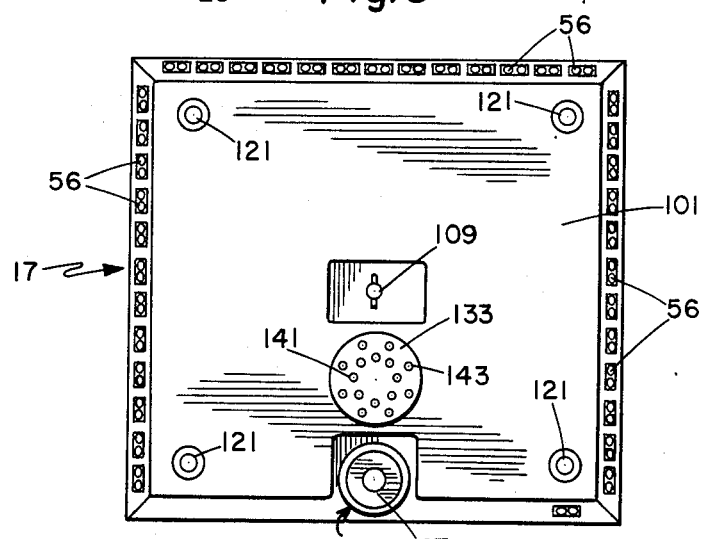
FIG. 4 is a rear view of the logic module.

The logic module 17 is magnetically connected with the power module. There are no electrical connections between them. This is shown in FIGS. 3 and 4. A ferrite magnetic core 47 is mounted in the logic module and is connected by wires to the elements in the logic module requiring power (not shown). A ferrite magnetic core 51 is mounted on the power module 23 and is connected by wires to the power source. When the logic module 17 and the power module 23 are assembled on the back plane, the ferrite cores 47 and 51 closely abut to transfer power from the power source to the logic module. No electric wires are involved in the coupling. Threaded receptacles 81 (FIG. 3) accept the I/O modules for screw connection as explained later in detail. Push buttons are mounted on the door 40 (FIG. 2) and are electrically connected to relays on the back of the control box. One such push button is indicated at 58 connected by wiring to relay 60. The relay 60 is connected by wiring to an I/O module 72.

Figure 12:
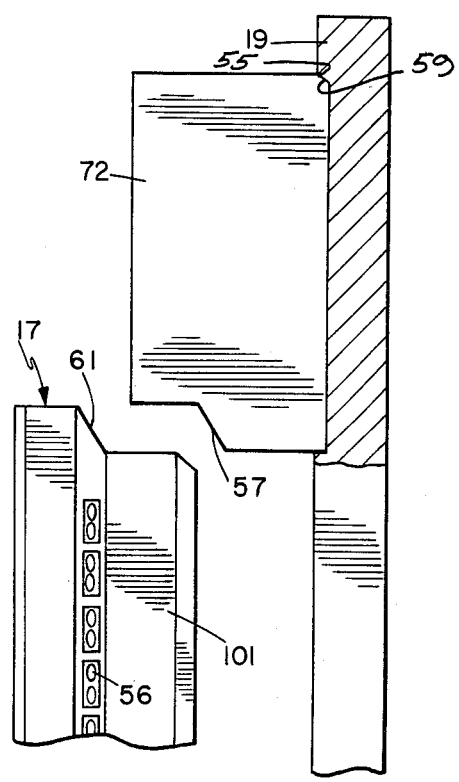
FIG. 12 illustrates the attachment of the logic module to the back plane with the I/O modules in place.
Figure 13:
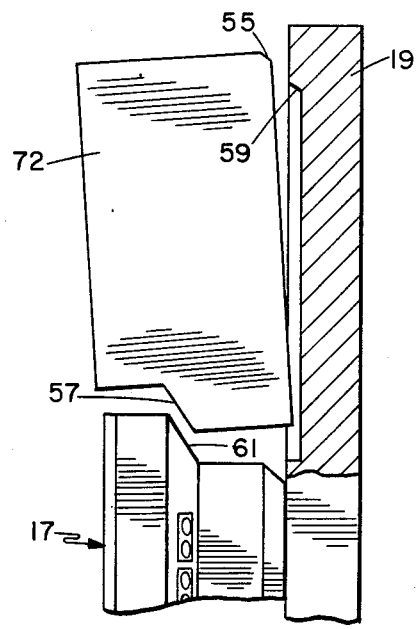
FIG. 13 illustrates the attachment of an I/O module to the back plane with the logic module in place.

FIGS. 5–7 show the details of an input/output (I/O) module 72, with FIG. 5 showing the I/O module and the logic module 17 joined. Openings 52 and 54 in the I/O module 72 will align with two of the openings 56 (FIG. 4) in the assembled position, and the lamp 39 connected with the printed circuit board 100 will indicate the condition of the circuit. The face of the logic module 17 preferably includes legends such as "A, B, C, D . . ." to identify the location for the particular I/O module 72. Referring to FIGS. 12 and 13 it will be noted that I/O module 72 has cam surfaces 55 and 57. These cam surfaces mate with cam surfaces 59 and 61 on the back plane 19 and logic module 17 respectively. These cam surfaces permit the logic module and I/O module to be attached to and removed from the back plane 19 without any required sequence.

If the I/O modules are attached first as shown in FIG. 12, the logic module 17 is positioned with cam surface 61 against cam surface 57 and the logic module is tightened into place. If the logic module is attached first as shown in FIG. 13, the cam surfaces 57 and 61 are engaged first and the I/O modure is rotated to engage cam surface 55 with cam surface 59. The I/O module is then tightened into place. The I/O module is removed by reversing the procedure.

FIGS. 5 and 6 show the I/O module 72 fastened to the back plane 19, the arrangement being typical at each module position. The I/O module includes a printed circuit board 63 inside. Screw holes 65, 66, 68 and 70 are provided for mounting screws 67. The mounting screw 67 is mounted inside a tube 69 and extends through a copper block 71 that has a connecting pin 73 soldered to the circuit board 63. A spring washer 77 is positioned between the block 71 and the head of screw 67. A copper rail 79 is mounted on the back of the back plane 19 and is fastened into the back of a brass receptacle 81 with screw 78. The screw 67 extending through the I/O module screws into the front of the receptacle 81. Thus, the screw 67 not only fastens the I/O module in place, it also connects the circuit board with the rail 79. Exoxy is poured over the printed circuit board 63.

The four holes 65, 66, 68 and 70 provide access to four electric buses or rails 79 on the back of back plane 19 (FIG. 5). These rails are identified as 12 V. A.C., 115 V. A.C. OUT, 115 V. A.C. IN and 12 V. A.C. on the I/O module adjacent the screw holes 65–70 as shown in FIG. 7. Screws are shown at 83 and 85 in FIG. 7 that fasten the ends of wires 87 and 88. The wires are screw connected to electrically operated devices (not shown).

The screws inserted into openings 65 and 70 are connected to two of the four rails on the back plane 19 and connect to the printed circuit board 63 to provide a twelve volt peak to peak square wave that is connected to a transformer and rectifier (not shown) on the printed circuit board in each I/O module to create five volts d.c. for powering the I/O module.

Figure 15A:
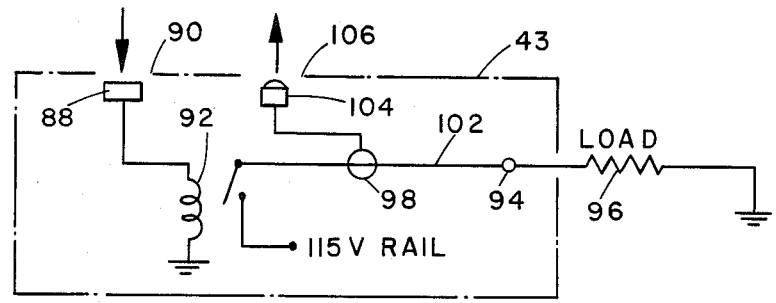
FIG. 15A is a schematic diagram of an output version of the I/O module.

The I/O module may be either an input module, an output module or both. FIG. 15A is a schematic diagram of an output version of the I/O module. An optic receiver 88 is aligned with the opening 90 in the body of the I/O module for receiving an optic signal from an aligned optic opening in the logic module. When a beam of light is transmitted to the optic receive 88 from the logic module, the light energizes a relay 92 to close a circuit to the connector 94. The connector 94 is connected to a load, such as a motor starter for example, as indicated at 96. A circuit sensing element 98 detects the flow of current in the wire 102. The sensing element 98 energizes the LED 104 which sends light through opening 106 into an aligned opening in the logic module. This signal lights a lamp 39 (FIG. 1) on the face of the logic module adjacent the I/O module indicating that it is active. Thus, if there is a loose wire on a terminal in the circuit so that the circuit is not conducting when the light beam from the logic module is turned on and the relay is actuated, it can be observed by viewing the indicating lamp on the logic module. The lamp will only be on when current is flowing.

Figure 15B:
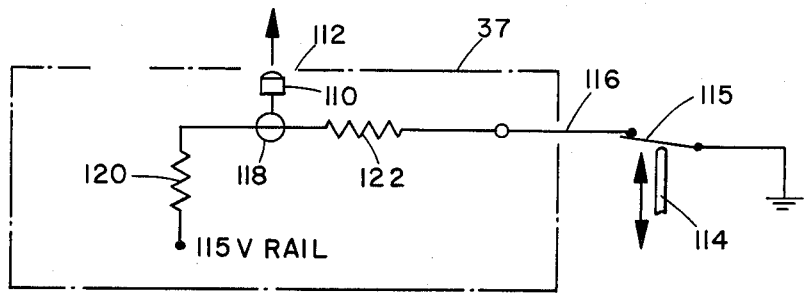
FIG. 15B is a schematic diagram of an input version of the I/O module.

An I/O module containing an input circuit is shown in FIG. 15B. A light transmitter 110 aligns with opening 112 in the module. This opening aligns with an opening and an optic receiver in the logic module (not shown). A limit switch is shown at 115 that is activated by a slide finger 114. The limit switch 115 is connected by wire 116 to an input circuit that includes the light transmitter 110, current sensor 118, resistors 120 and 122, and a connection to the 115 volt rail. When the limit switch is closed, the light transmitter 110 transmits a light beam to the receiver in the logic module. The receiver stores this information in memory and also lights an indicator lamp 39 on the face of logic module 17. When the limit switch opens, the beam of light is turned off. This is input information to the logic module.

Figure 15C:
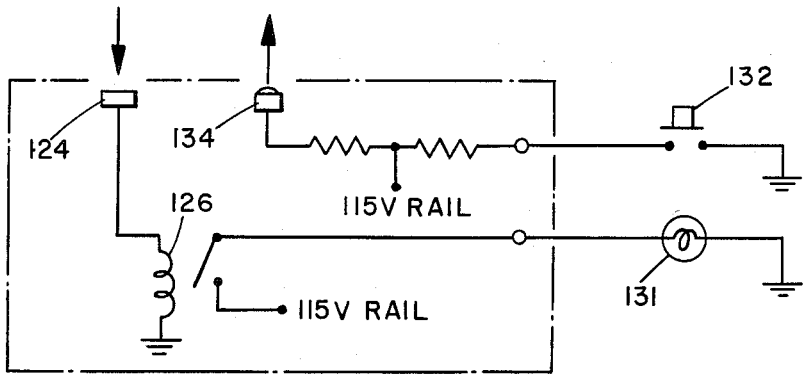
FIG. 15C is a schematic diagram of an I/O module used with lighted push buttons.

FIG. 15C is a schematic diagram of an I/O module used with a push button. An optic receiver 124 receives light pulses from the logic module (not shown) and energizes relay 126 which pulses on lamp 131. This lamp can be inside or adjacent the push button 132. The flashing light indicates that the operation represented by the push button is a valid operation and may be selected at this point in time. Thus, the operator knows that if he presses this button he can initiate this operation.

When the operator presses push button 132 he closes the circuit to LED 134. This information is transmitted to a light receiver in the logic module (not shown) and the logic module now energizes relay 126 with a steady light beam so that lamp 131 produces a steady light to show that the operation has been initiated.

Thus the operator can look at the push button panel and known which operations are in effect (steady light), which operations he can initiate (flashing light) and which operations are unavailable (no light).

This same arrangement can be applied to limit switches if desired by placing lamps adjacent the limit switches.

Two independent 115 volt a.c. rails afford independent control, one for power out to devices and one for power to devices which will send signals into the logic module. This makes it possible to check all inputs with no power going out and to check outputs without tripping limits switches, etc.

FIG. 5 shows a typical connection between an I/O module 72 and the logic module 17. A fiber optic receiver is shown at 91 soldered to a riser 93 on the printed circuit board 63 in the I/O module. This fiber optic receiver 91 aligns with fiber optic sender 95 in the logic module 17. A clear, compliant silicone seal 97 is affixed to the I/O module with glue or the like and is compressed when the I/O module is affixed to the logic module. The seal is compressed 0.002 inch to squeeze moisture out as the I/O module is assembled in place. The cam surfaces 55 and 59 draw the fiber optic receiver 91 and the fiber optic sender 95 into alignment as the I/O module is connected. The fiber optic sender 95 is soldered to printed circuit board 100 in the logic module 17. A light 39 is connected to printed circuit board 100 and will indicate when current is flowing through the circuit containing the optic sender 95 and optic receiver 91.

Figures 8, 9:
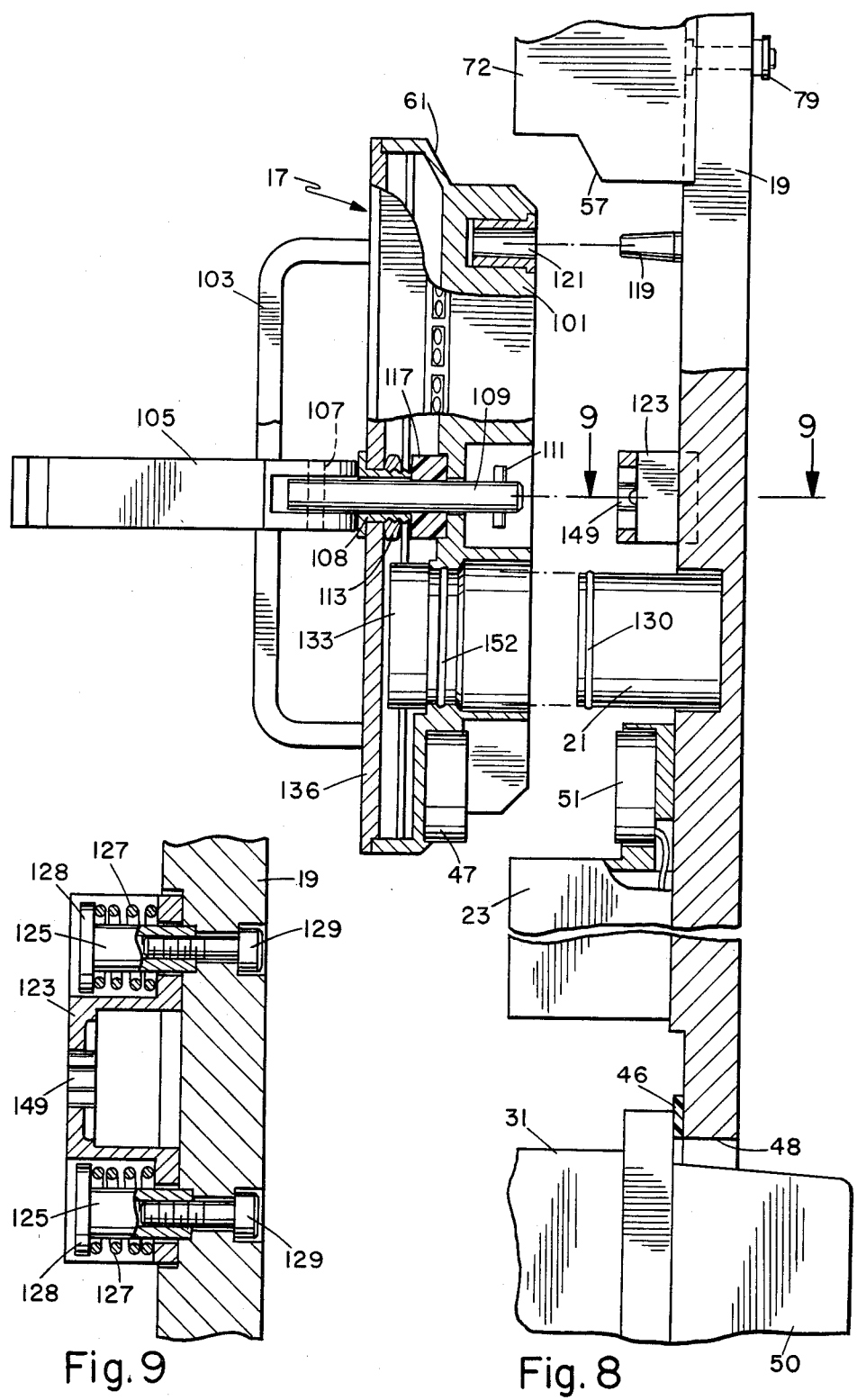
FIG. 8 is an enlarged side elevation view, with portions cut away, of the structure of FIG. 3, showing the logic module being attached.
FIG. 9 is a sectional view taken on line 9—9 of FIG. 8.

FIG. 8 shows the logic module 17 positioned for insertion onto the back plane 19. The logic module includes a body 101 with a pair of hand grips 103 extending from the face. The hand grips are positioned one on each side of a lock lever 105. The hand grips 103 are provided for gripping when attaching the logic device onto the back plane or removing if from the back plane. The block lever 105 is bifurcated and pivotally connected through a threaded barrel 108 at 107 with the pin 109. A nut 113 is threaded onto the barrel 108 to hold the lock lever 105 onto the logic module cover 136. The logic module cover 136 is affixed to the logic module body 101 by suitable means such as cap screws. The pin 109 extends through the body of the logic module and has a lock finger 111 near its free end. The lock lever includes a rounded cam 138 for riding on the face of the logic module cover 136. A sealing ring 117 surrounds the pin 109 and seals the interior of the logic device. Four tapered pins 119 are positioned on the back plane 19 for seating in tapered seats 121 in the logic device body 101.

A lock housing 123 is connected to the back plane 19 as shown in FIG. 9. Near each end of the face of the lock housing a pin 125 extends into the lock housing and has a hollow threaded interior. A spring 127 surrounds each pin 125 and extends between head 128 of pin 125 and the back wall of the lock housing 123. A threaded fastener 129 is screwed into the pin 125 and holds the lock housing 123 against the back plane 19.

The logic module 17 is connected to the back plane 19 by inserting the logic module seats 121 over the back panel pins 119 with the lock lever 105 in the position shown in FIG. 8 and the lock finger 111 extending vertically. Lock finger 111 is inserted through the opening 131 and the lock handle is rotated ninety degrees to the dotted line position shown in FIG. 10 so that the finger 111 will pull against the front wall of the lock housing 123. The lock lever 105 is then rotated downward about the pivot pin 107 with the cam surface 183 engaging the face of logic module cover 136. This action pulls the finger 111 against the front wall of lock housing 123 and pulls the back wall of lock housing against spring 127 to lock the logic module 17 onto the back plane 19. The logic module is removed from the back plane by reversing the procedure. A sealing ring 130 is positioned on the personality module 21 for seating in groove 152 in the logic module 17.

Figure 10:
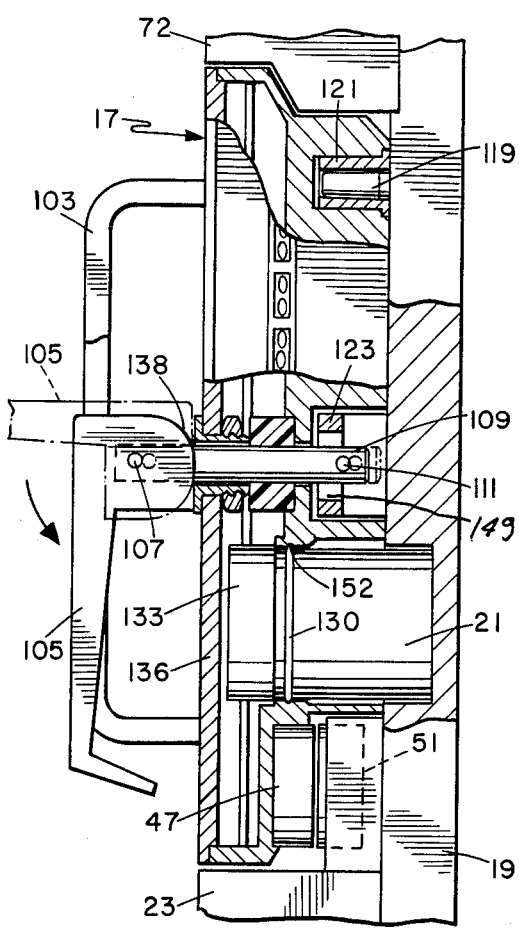
FIG. 10 is a view similar to FIG. 8, showing the logic module secured in place.

The personality module 21 is affixed to the back plane 19 and is a permanent part of the station. It abuts the personality module accommodater 133 in the logic module 17 when assembled (FIG. 10).

Figure 11:
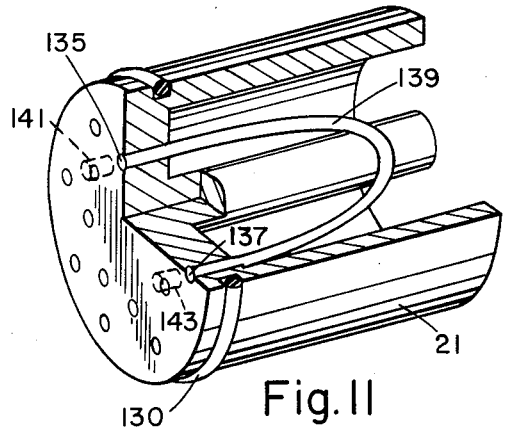
FIG. 11 is a perspective view, partly sectioned, of the personality module used to identify the control station.

The personality module detail is shown in FIG. 11 with an LED 141 and an optic detector 143 in the logic module 17 shown in phantom. Eight openings 135 are provided in an inner circle and eight openings 137 are provided in an outer circle in the face of the personality module. A similar arrangement is provided on the personality module accommodater 133 on the logic module 17 (FIG. 4) with LEDs 141 in the inner circle of openings and optic detectors 143 in the outer circle of openings. A light pipe 139 connects each inner opening 135 with a particular outer opening 137 to provide a unique pattern or number for the station as shown in FIG. 11.

The LEDs 141 in the logic module serially flash light pulses around the inner circle of openings 135. The optic detectors 143 in the logic module 17 indicate which outer opening is connected to which inner opening and this information is serially fed back to the logic module to indicate its unique pattern or number. The logic module serially turns the LEDs on one at a time and then scans all eight detectors in the outer circle. The logic module can then report its identity to the communications loop 11 (FIG. 1) through the optic link 15. If the logic module sees no light or more than one light during a scan it knows there is an error and shuts the system down. The embodiment shown uses an eight opening pattern but other numbers can be used. Other approaches to identification just look and cannot tell if the identifier is in error as long as its sees an identifier.

TESTING

Figure 14:
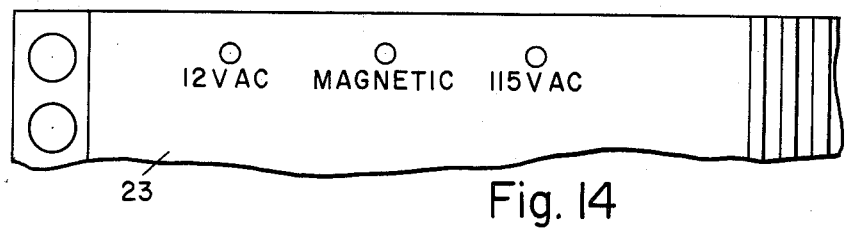
FIG. 14 is an enlarged front view of the power module of the present invention showing the indicator lights.

Testing is quickly and easily accomplished according to the following procedure:

FIG. 14 shows indicating lamps on the front of the power module 23 that indicate the state of the 12 volt a.c. power, the magnetic coupling of the power supply to the logic module, and the 115 volt a.c. line voltage. If a problem arises, the lamps are visually checked.

If the power supply indicating lamps show that all power is intact then the indicating lamps on the face of the logic module are visually inspected. If one of these indicating lamps should be on but is not then further investigation is required.

FIG. 16 shows a testing device 151. One end of the testing device includes an opening 153 that communicates with a light transmission element inside the testing device. A push button 155 turns the light transmission element on and off. The testing device 151 also includes an opening 157 at the other end that communicates with a light sensing element inside the testing device. A push button 159 actuates the light sensing device. If light is received, the lamp 161 is turned on to show this condition.

FIG. 17 demonstrates the testing device 151 used in checking an output module. The logic module 17 has been removed from its position adjacent the I/O modules. The button 155 is depressed and light is emitted from opening 153 in the testing device into opening 54 in the I/O module 43. A second testing device 151 is held with its opening 157 adjacent the opening 52 in the I/O module. The button 159 on the second testing device is depressed. If the circuit shown in FIG. 15A is intact, the lamp 161 on the testing device will be lit.

An input module with the circuit shown in FIG. 15B is tested by placing the opening 157 in the testing device 151 adjacent the opening in the I/O module and pressing the button 159. The limit switch 115 shown in FIG. 15B is closed by hand or a push button. If the circuit shown in FIG. 15B is complete, the indicating lamp 161 on testing device 151 is lit.

Figure 18:
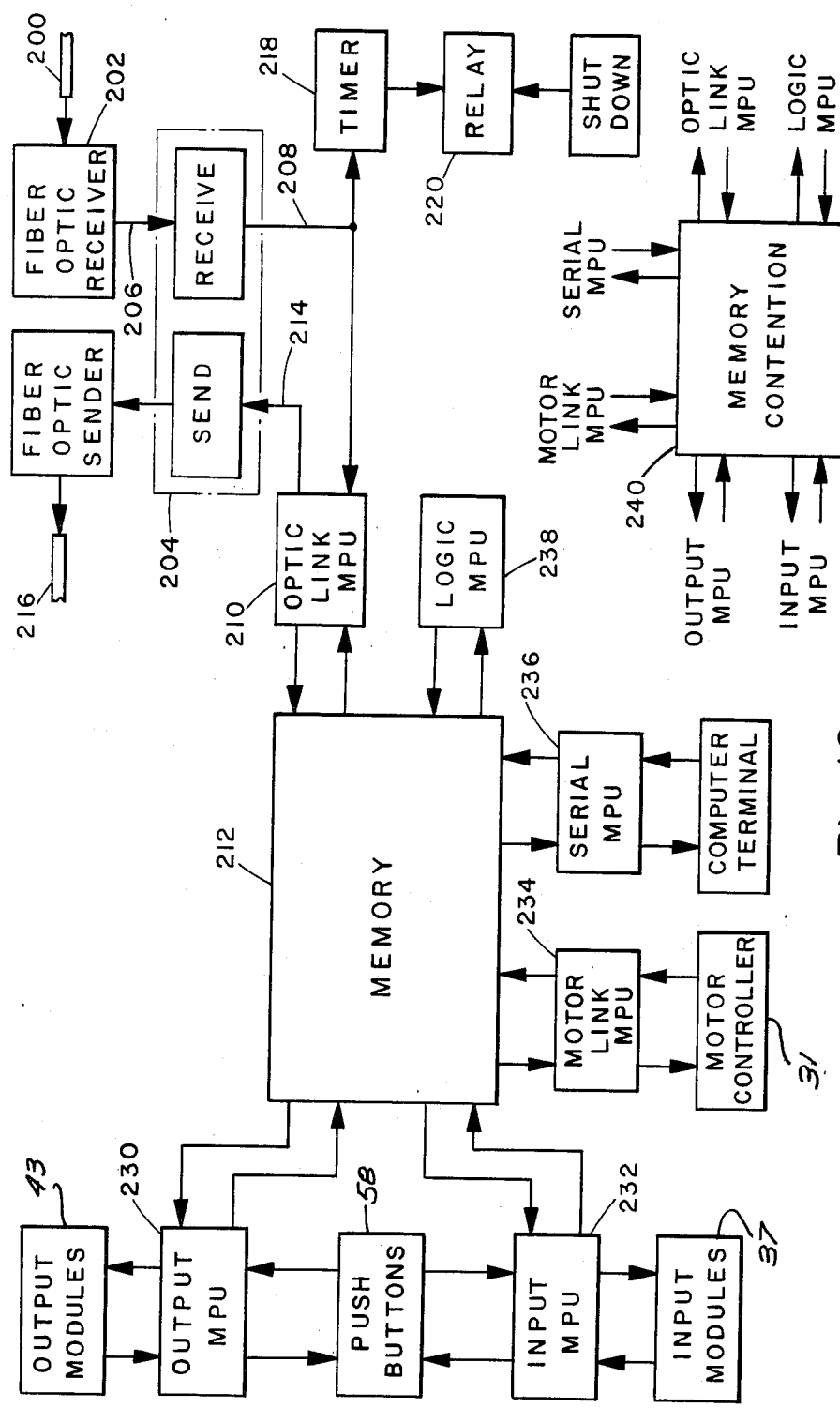
FIG. 18 is a schematic diagram of the work station system.

FIG. 18 is a schematic diagram of the logic module 17. The input of light pulses from the optic loop 11 shown in FIG. 1 enters via the fiber optic cable 200 and is fed through fiber optic receiver 202 into the receive portion of chip 204, which can be an 8250 for example, via line 206. The input travels via character received line 208 to Optic Link MPU 210 which can be a Zilog Z80 or any one of many other well known microprocessors. MPU 210 interfaces with memory 212 that is peferably a non-volatile bubble memory that will accept either read or write instructions. The input is stored in memory, recalled, and processed further by the microprocessor. The MPU 210 communicates as required via line 214 with the send portion of chip 204 where information in the form of light pulses is sent via line 216 back onto the optic loop 11 of FIG. 1. Memory 212 also stores the operating program for the work station.

A pulse driven timer 218 is connected to character received line 208 and is also connected to a solid state watch dog relay 220. As long as light pulses are being sent along line 208 every ten milliseconds the system continues to function. When a ten millisecond time period has passed with no character received passing through line 208, the pulse driven timer 218 pulls out the watch dog relay and shuts the system down.

The memory 212 is public memory that is available to the several MPUs. An Output MPU 230 communicates with memory 212 and the output modules. An Input MPU 232 communicates with memory 212 and the input modules. The pushbuttons communicate with the Output MPU and the Input MPU. A Motor Link MPU 234 communicates with memory and the motor controller. A Serial MPU communicates with memory and a computer terminal. A Logic MPU 238 communicates with memory and executes the logic for operating the machine. These MPUs may be Z80s or any one of many well known microprocessors.

The Output MPU 230 and Input MPU 232 communicate with the personality module to establish identity when the system is first powered up. When identity is established, they switch to communication with the input modules and output modules.

Since several MPUs have access to the same memory, it is necessary to organize memory access. This is done with Memory Contention Chip 240. In the present instance it has been done with a PAL (programmable array logic) chip sold by MMI, Model 20X10. The Memory Contention Chip is programmed in conventional fashion whereby each MPU communicates with chip 240 via a memory request line and an access granted line. Memory Contention Chip 240 includes a priority assignment whereby the highest priority is assigned to the lowest numbered MPU. In this case the Optic Link MPU is assigned the number 1 and has the highest priority. The Serial MPU is assigned the number 2. The Motor Link MPU is assigned the number 3. The Output Module MPU is assigned the number 4. The Input Module MPU is assigned the number 5. The Logic Module MPU is assigned the number 6.

If two MPUs make a simultaneous request by setting their request lines low, the Memory Contention Chip grants access to memory on the grant line of the MPU with the lower number.

The control device of the present invention is sealed against contamination and is protected against electrical noise from an industrial environment. All signal coupling is through optic links. There are no sliding contacts. All power coupling is through attachment screws or magnetic coupling.

Having thus described my invention, I claim:

1. A control device, comprising:
   logic means positioned on support means for generating and receiving optic signals according to a logic sequence and containing first magnetic coupling means;
   power supply means for generating electrical power and containing second magnetic coupling means adapted for positioning on said support means adjacent said first magnetic coupling means for forming a magnetic coupling between said logic means and said power supply means to supply power to said logic means;
   first optic coupling means in said logic means for generating and receiving optic logic signals;
   input/output means positioned on said support means and having second optic coupling means for forming an optic coupling with said first optic coupling means to conduct optic input and output signals; and
   connecting means on said input/output means for connecting said input/output means to operational elements;
   whereby coupling between said logic means, power supply means and input/output means is devoid of electrical contacts.

2. A control device according to claim 1 that is completely sealed against industrial contamination.

3. A control device according to claim 1 including attaching means whereby the logic means is attachable to and depluggable from said support means by simple mechanical motion without removing any electric wire connections and without utilizing separate fasteners.

4. A control device according to claim 1 wherein the said input/output means includes separate input elements and output elements removably affixed to said support means and containing photot optic sending means and photo optic receiving means for communicating with said logic means.

5. A control device according to claim 4 wherein said support means includes electrical bus means, and said input elements and output elements are connected to said electrical bus means by a fastening means which also creates the electrical contact with the input and output elements.

6. A control device according to claim 1 or 4 wherein the logic means and input/output means is constructed and arranged so that the assembling of the logic means and input/output means does not require any particular sequence.

7. A control device according to claim 1 or 4 wherein said logic means and said input/output means include cam surfaces that increase contact between them when they are assembled.

8. A control device according to claim 4 wherein sealing means is positioned between the logic means and the input/output elements for compression during assembly.

9. A control device according to claim 1 wherein said logic means, power supply means and input/output means include indicating means to show active circuits for analysis and fault diagnosis.

10. A control device according to claim 1 wherein said input/output means includes means for diagnosing errors.

11. A control device according to claim 4 wherein said input/output means includes means for diagnosing errors.

12. A control device according to claim 1 wherein identifying means is attached to said support means as a permanent component for communicating with said logic means to identify the control location.

13. A control device according to claim 12 wherein the identifying means is passive and communicates with said logic means solely via third optic coupling means.

14. A control device according to claim 12 or 13 wherein the identifying means includes a first series of openings and a second series of openings;
    light pipes connect each of said first series of openings with one of the openings in said second series of openings to form a particular unique pattern; and
    the logic module includes a plurality of light emitting means disposed one adjacent each of said first series of openings in the identifying means, and a plurality of light receiving means disposed one adjacent each of the second series of openings in the identifying means.

15. A control device according to claim 14 wherein a seal is positioned between the identifying means and the logic module to seal against light leakage when light is transmitted between the logic module and the identifying means.

16. A control device according to claim 14 wherein the logic module includes means for serially producing light pulses one at a time in each of said light emitting means, and means for scanning all of said optic receiving means after each light pulse is issued to determine whether the system is functioning properly.

17. A control station which includes station support structure, station logic module means including means for removably mounting said logic module means to said support structure, and means on said support structure and said logic module means for transmitting communication signals on communication lines to and from said logic module means for conducting controlled operations at said station, said means for transmitting communication signals comprising
    first optical coupling means mounted on said support structure and connected to said communication lines, second optical coupling means carried by said logic module means, and means on said support structure and on said logic module means for aligning said first and second optical coupling means when said logic module means is assembled to said support structure such that communicatin signals on said lines are transmitted to said logic module means without direct electrical connection to said logic module means.

18. The control station set forth in claim 17 further comprising power module means on said support structure and means coupling power from said power module means to said logic module means, said power-couling means comprising
    first electromagnetic coupling means mounted on said support structure and second electromagnetic coupling means carried by said logic module means, said aligning means functioning to align said first and second electromagnetic coupling means is assembly such that power is supplied to said logic module means from said power module means without direct electrical connection therebetween.

19. The control station set forth in claim 17 or 18 wherein said support structure comprises a backplane having a multiplicity of module mounting positions, and wherein said first optical coupling means comprises I/O modules mounted to said backplane in selected ones of said module positions.

20. The control station set forth in claim 19 wherein said backplane includes a plurality of I/O power buses, and wherein said I/O modules include means for simultaneously removably mounting said I/O modules to said backplane and obtaining electrical connection to said I/O power buses.

21. The control station set forth in claim 20 further comprising opposing cam surface pairs on said backplane and said I/O modules, and on said I/O modules and said logic module means for permitting removal of I/O module means from said backplane with said logic module means assembled thereto while simultaneously cooperating with said aligning means for aligning said optical and electromagnetic coupling means.

22. The control station set forth in claim 17 or 18 further comprising means on said support structure for identifying station character to said logic module means, said station character identifying means comprising
third optical coupling means carried by said support structure and fourth optical coupling means carried by said logic module means, said aligning means functioning in assembly to align said third and fourth optical coupling means such that information regarding station character is conveyed to said logic module means without direct electrical connection to said logic module means.

23. The control station set forth in claim 22 wherein said third optical coupling means comprises first and second series of optical apertures and optical transmitting means selectively connecting apertures of said first series to apertures of said second series, and wherein said fourth optical coupling means comprises optical transmitting means on said logic module means for alignment with said first series of apertures and optical receiving means on said logic module means for alignment with said second series of apertures.

24. The control station set forth in claim 17 or 18 characterized in that said removable mounting means comprises a housing mounted on said support structure, said housing including a keyhole aperture, a shaft rotatably carried on said logic module means and including means at one end for reception into said aperture, and means for rotating said shaft.

25. The control station set forth in claim 24 wherein said removable mounting means further comprises resilient means biasing said housing against said support structure, and means on said rotating means for drawing said shaft and said means against said housing against said resilient means.

* * * * *